United States Patent
Yang

(10) Patent No.: US 8,498,163 B2
(45) Date of Patent: Jul. 30, 2013

(54) SEMICONDUCTOR MEMORY APPARATUS AND DATA ERASING METHOD

(75) Inventor: Chul Woo Yang, Ichon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 73 days.

(21) Appl. No.: 13/193,933

(22) Filed: Jul. 29, 2011

(65) Prior Publication Data

US 2012/0206975 A1 Aug. 16, 2012

(30) Foreign Application Priority Data

Feb. 14, 2011 (KR) ........................ 10-2011-0012836

(51) Int. Cl.
*G11C 11/34* (2006.01)

(52) U.S. Cl.
USPC ............ 365/185.29; 365/185.18; 365/185.19; 365/185.22

(58) Field of Classification Search
USPC ............. 365/185.29, 185.11, 185.18, 185.19, 365/185.33, 185.12, 185.22
See application file for complete search history.

(56) References Cited

U.S. PATENT DOCUMENTS

| 2008/0158994 | A1* | 7/2008 | Yang | 365/185.33 |
| 2010/0182839 | A1* | 7/2010 | Kim et al. | 365/185.19 |
| 2011/0273936 | A1* | 11/2011 | Yu et al. | 365/185.11 |

FOREIGN PATENT DOCUMENTS

| KR | 100811274 B1 | 2/2008 |
| KR | 10-2009-0002480 A | 1/2009 |
| KR | 1020090121984 A | 11/2009 |

* cited by examiner

*Primary Examiner* — Richard Elms
*Assistant Examiner* — Hien Nguyen
(74) *Attorney, Agent, or Firm* — William Park & Associates Patent Ltd.

(57) ABSTRACT

A data erasing method of a semiconductor memory apparatus may include: if any one threshold voltage of a plurality of memory cells, for which an erase operation has been performed using an erase voltage pulse, is higher than an erase verification voltage, increasing a voltage level of the erase verification voltage applied to a plurality of word lines of the plurality of memory cells until the threshold voltage of the plurality of memory cells is lower than the erase verification voltage, and increasing a voltage level of the erase voltage pulse by an increased voltage level of the erase verification voltage and applying the erase voltage pulse to the plurality of memory cells.

14 Claims, 3 Drawing Sheets

SEMICONDUCTOR MEMORY APPARATUS AND DATA ERASING METHOD

CROSS-REFERENCE TO RELATED APPLICATION

The present application claims priority under 35 U.S.C. §119(a) to Korean Application No. 10-2011-0012836, filed on Feb. 14, 2011, in the Korean Intellectual Property Office, which is incorporated herein by reference in its entirety as if set forth in full.

BACKGROUND

1. Technical Field

Various embodiments of the present invention relate to a semiconductor memory apparatus and related methods. In particular, certain embodiments relate to a technology of performing a data is erasing operation.

2. Related Art

A flash memory apparatus, which is a representative example of a non-volatile memory apparatus, includes a non-volatile memory cell array. Each non-volatile memory cell includes a transistor having a control gate and a floating gate.

Among a memory cell, a single-level cell (SLC) capable of storing 1-bit data has two threshold voltage distributions. A multi-level cell (MLC) capable of storing 2-bit data has four threshold voltage distributions. A threshold voltage distribution at the lowest level is formed when an erase operation is performed. Here, the threshold voltage distribution may be called a data distribution, which is similar to a Gaussian distribution.

If the level of the threshold voltage distribution formed when the erase operation is performed is substantially lower than that of an erase verification voltage, a programming operation is performed once again after the erase operation to form a threshold voltage distribution with a desired voltage level and shape. The programming operation performed after the erase operation for that purpose is defined as a soft programming.

Furthermore, if the level of the threshold voltage distribution formed when the erase operation is performed is higher than the erase verification voltage, it may be necessary to perform the erase operation once again by increasing the voltage level of an erase voltage pulse.

SUMMARY

Accordingly, there is a need for an improved semiconductor memory apparatus capable of controlling an erase threshold voltage distribution of a memory cell to quickly reach an erase verification voltage, and a data erasing method of the semiconductor memory apparatus.

To attain the advantages and in accordance with the purposes of the invention, as embodied and broadly described herein, one exemplary aspect of the present invention may provide a data erasing method of a semiconductor memory apparatus which includes: if any one threshold voltage of a plurality of memory cells, for which an erase operation has been performed using an erase voltage pulse, is higher than an erase verification voltage, increasing a voltage level of the erase verification voltage applied to a plurality of word lines of the plurality of memory cells until the threshold voltage of the plurality of memory cells is lower than the erase verification voltage; and increasing a voltage level of the erase voltage pulse by an increased voltage level of the erase verification voltage and applying the erase voltage pulse to the plurality of memory cells.

In another exemplary aspect of the present invention, a semiconductor memory apparatus may include: a memory unit including a plurality of memory cells; and a control unit configured to, if a threshold voltage of the plurality of memory cells, for which an erase operation has been performed using an erase voltage pulse, is higher than an erase verification voltage, increase a voltage level of the erase verification voltage applied to a plurality of word lines of the plurality of memory cells until the threshold voltage of the plurality of memory cells is lower than the erase verification voltage, increase a voltage level of the erase voltage pulse by an increased voltage level of the erase verification voltage, and apply the erase voltage pulse to the plurality of memory cells.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

DETAILED DESCRIPTION

Figure 1:
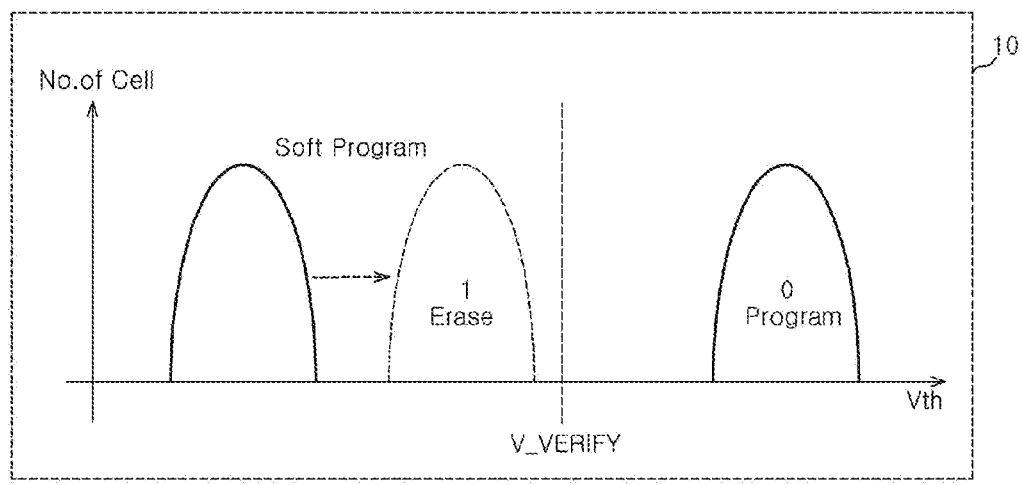
FIG. 1 is a diagram illustrating a threshold voltage distribution of a memory cell for an erase operation.
Figure 1:
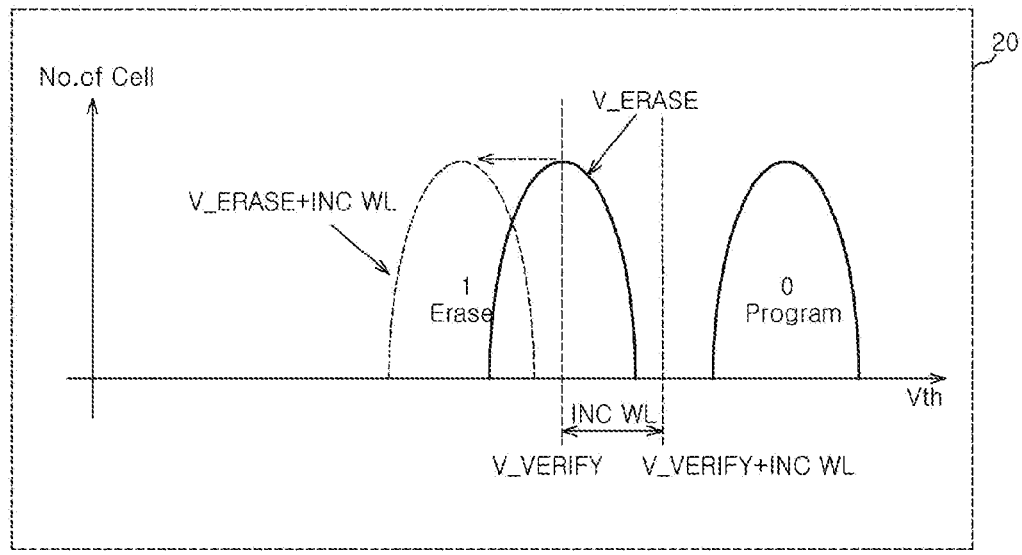

Reference will now be made in detail to the exemplary embodiments consistent with the present disclosure, examples of which are illustrated in the accompanying drawings. Wherever possible, the same reference characters will be used throughout the drawings to refer to the same or like parts.

FIG. 1 is a diagram illustrating a threshold voltage distribution of a memory cell for an erase operation.

Referring to FIG. 1, in a first threshold voltage distribution 10, after an erase operation is performed, the level of an erase threshold voltage distribution is substantially lower than that of an erase verification voltage V_VERIFY. Therefore, a programming operation is performed once again after the erase operation to form a threshold voltage distribution with a desired voltage level and shape. That is, the threshold voltage distribution is moved closer to the level of the erase verification voltage V_VERIFY. As described above, the programming operation performed after the erase operation is defined as a soft programming.

In a second threshold voltage distribution 20, after the erase operation is performed using an erase voltage pulse V_ERASE, an area occurs where the erase threshold voltage distribution exceeds the erase verification voltage V_VERIFY.

In such a case, it is necessary to perform the erase operation again. It is desirable that the level of a final erase threshold voltage distribution is close enough to the erase verification voltage V_VERIFY but lower than the erase verification voltage V_VERIFY. That is, it is desirable that the maximum threshold voltage of a plurality of memory cells reach the erase verification voltage V_VERIFY.

In order to control the erase threshold voltage distribution as described above, it is necessary to apply an erase voltage pulse V_ERASE+INC WL again which has a level higher than the initially applied erase voltage pulse V_ERASE by an offset voltage INC WL. If the offset voltage INC WL is substantially low, it is necessary to increase the voltage level of the erase voltage pulse. If the offset voltage INC WL is substantially high, it is necessary to set an appropriate offset voltage INC WL because a soft programming operation may be required.

In the present embodiment, after the erase operation is performed using the erase voltage pulse V_ERASE, an erase verification operation is performed while gradually increasing an erase verification voltage V_VERIFY applied to word lines. That is, if any one threshold voltage of a plurality of memory cells, for which an erase operation has been performed using an initial erase voltage pulse V_ERASE, is higher than the erase verification voltage V_VERIFY, that is, if an erase verification operation was not successful, the voltage level of the erase verification voltage V_VERIFY applied to a plurality of word lines of the plurality of memory cells is increased until all the threshold voltages of the plurality of memory cells are lower than the erase verification voltage V_VERIFY. In the embodiment, the above-described conditions are satisfied when applying the erase verification voltage V_VERIFY+INC WL higher than the initial erase verification voltage V_VERIFY by the offset voltage INC WL.

Then, when the erase voltage pulse V_ERASE+INC WL with a voltage level higher than the initial erase voltage pulse V_ERASE by the offset voltage INC WL is applied to the bulk of the plurality of memory cells, the erase threshold voltage distribution is close enough to the erase verification voltage V_VERIFY but lower than the erase verification voltage V_VERIFY.

That is, in the embodiment, an optimal offset voltage is determined while gradually increasing the erase verification voltage V_VERIFY applied to the word lines when the erase verification operation is performed.

Figure 2:
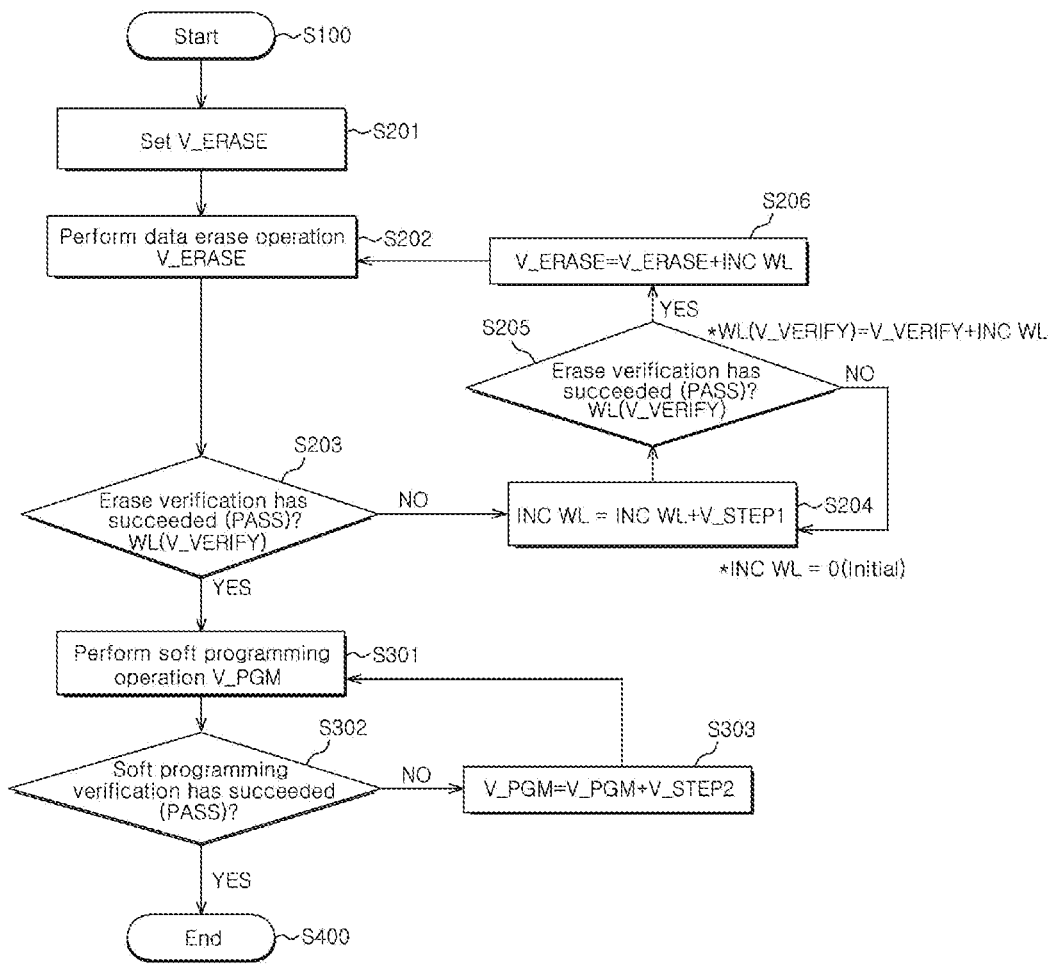
FIG. 2 is a flowchart illustrating a data erasing method of a semiconductor memory apparatus according to one embodiment.
Figure 3:
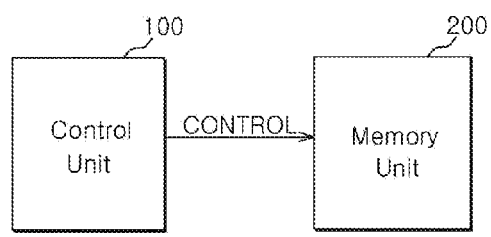
FIG. 3 is a configuration diagram of a semiconductor memory apparatus according to one embodiment.

FIG. 2 is a flowchart illustrating a data erasing method of a semiconductor memory apparatus according to one embodiment, and FIG. 3 is a configuration diagram of the semiconductor memory apparatus according to one embodiment.

Hereinafter, the data erasing method of the semiconductor memory apparatus will be described with reference to the flowchart of FIG. 2 and FIG. 3.

A semiconductor memory apparatus 1 may include a control unit 100 and a memory unit 200.

The memory unit 200 may include a plurality of memory cells. The control unit 100 is configured to generally control a data read operation, a data verification operation, an erase operation and the like, which are performed by the memory unit 200.

According to the data erasing method of the semiconductor memory apparatus, if a threshold voltage of the plurality of memory cells, for which an erase operation has been performed using an erase voltage pulse V_ERASE, is higher than an erase verification voltage V_VERIFY, that is, if an erase verification operation was not successful, the voltage level of the erase verification voltage V_VERIFY applied to a plurality of word lines of the plurality of memory cells is increased until the threshold voltage of the plurality of memory cells is lower than the erase verification voltage V_VERIFY (S201, S202, S203, S204, S205), the erase voltage pulse V_ERASE is increased by an increased voltage level INC WL of the erase verification voltage V_VERIFY and is applied to the plurality of memory cells (S206, S202), and when the threshold voltage of the plurality of memory cells, for which the erase operation has been performed using the erase voltage pulse V_ERASE, is lower than the erase verification voltage V_VERIFY, that is, when the erase verification operation was successful, the voltage level of a soft programming voltage pulse V_PGM applied to the plurality of word lines is increased until a maximum threshold voltage of the plurality of memory cells reaches the erase verification voltage V_VERIFY (S301, S302, S303).

Here, it is assumed that the plurality of memory cells are flash memory cells. The flash memory cell may include a control gate and a floating gate. When a programming voltage pulse is applied to the control gate of the flash memory cell, a tunnel phenomenon occurs in the floating gate, so that a programming operation is performed. When an erase voltage pulse is applied to the bulk of the memory cell, the tunnel phenomenon occurs in the floating gate, so that an erase operation is performed. The programming voltage pulse is transferred to the memory cell through word lines. The memory cell substantially maintains one of a programming state and an erase state. When a verification voltage is applied to the word lines and a transistor of the memory cell is turned on, the state of the memory cell is determined as the erase state. When the transistor of the memory cell is turned off, the state of the memory cell is determined as the programming state. That is, when the threshold voltage of the memory cell is lower than the verification voltage, the state of the memory cell may be defined as the erase state. When the threshold voltage of the memory cell is higher than the verification voltage, the state of the memory cell may be defined as the programming state. In the embodiment, a soft programming operation using the soft programming voltage pulse V_PGM is performed using an incremental step pulse programming (ISPP) scheme. An erase operation using the erase voltage pulse V_ERASE is performed using an incremental step pulse erasing (ISPE) scheme.

Hereinafter, the data erasing method of the semiconductor memory apparatus as described above will be described in more detail.

First, the step of increasing the voltage level of the erase verification voltage V_VERIFY may include a step (S201) of setting an initial level of the erase voltage pulse V_ERASE, a step (S202) of performing the erase operation with respect to the plurality of memory cells using the erase voltage pulse V_ERASE, a step (S203) of verifying whether the threshold voltage of the plurality of memory cells, for which the erase operation has been performed, is higher than the erase verification voltage V_VERIFY, and steps (S204, S205) of performing a verification operation while increasing the voltage level of the erase verification voltage V_VERIFY until the threshold voltage of the plurality of memory cells is lower than the erase verification voltage. The initial level of the erase voltage pulse V_ERASE is set as a voltage level when the erase operation has been successfully performed before. In the step (S203) of performing the verification operation using the erase verification voltage V_VERIFY, the voltage level of the erase verification voltage V_VERIFY is locked to the initially set voltage level. In the steps (S204, S205) of performing the verification operation while increasing the voltage level of the erase verification voltage V_VERIFY, the verification operation is performed while gradually increasing the initially set voltage level of the erase verification voltage V_VERIFY.

Then, the step of increasing the voltage level of the erase voltage pulse V_ERASE and applying the erase voltage pulse V_ERASE to the plurality of memory cells may include a step (S206) of increasing the voltage level of the erase voltage pulse V_ERASE by the increased voltage level INC WL of the erase verification voltage V_VERIFY, and a step (S202) of performing the erase operation with respect to the plurality of memory cells using the increased erase voltage pulse V_ERASE+INC WL.

Last, the step of increasing the voltage level of the soft programming voltage pulse V_PGM may include a step (S301) of performing the soft programming operation with respect to the plurality of memory cells using the soft programming voltage pulse V_PGM, a step (S302) of verifying whether the maximum threshold voltage of the plurality of memory cells has reached the erase verification voltage V_VERIFY, and steps (S303, S301) of increasing the soft programming voltage pulse V_PGM by a predetermined level and then applying the soft programming voltage pulse V_PGM to the plurality of word lines when the maximum threshold voltage of the plurality of memory cells has not reached the erase verification voltage V_VERIFY.

According to the data erasing method of the semiconductor memory apparatus as described above, it is possible to control the erase threshold voltage distribution of the memory cell to quickly reach the erase verification voltage, thereby improving the efficiency of the erase operation.

While certain embodiments have been described above, it will be understood to those skilled in the art that the embodiments described are by way of example only. Accordingly, the semiconductor memory apparatus and the data erasing method of the semiconductor memory apparatus described herein should not be limited based on the described embodiments. Rather, the semiconductor memory apparatus and the data erasing method of the semiconductor memory apparatus described herein should only be limited in light of the claims that follow when taken in conjunction with the above description and accompanying drawings.

What is claimed is:

1. A data erasing method of a semiconductor memory apparatus, comprising:
   if any one threshold voltage of a plurality of memory cells, for which an erase operation has been performed using an erase voltage pulse, is higher than an erase verification voltage, increasing a voltage level of the erase verification voltage applied to a plurality of word lines of the plurality of memory cells until the threshold voltage of the plurality of memory cells is lower than the erase verification voltage; and
   increasing a voltage level of the erase voltage pulse by an increased voltage level of the erase verification voltage and applying the erase voltage pulse to the plurality of memory cells.

2. The data erasing method according to claim 1, further comprising:
   when the threshold voltage of the plurality of memory cells, for which the erase operation has been performed using the erase voltage pulse, is lower than the erase verification voltage, increasing a voltage level of a soft programming voltage pulse applied to the plurality of word lines until a maximum threshold voltage of the plurality of memory cells reaches the erase verification voltage.

3. The data erasing method according to claim 1, wherein increasing the voltage level of the erase verification voltage comprises:
   setting an initial level of the erase voltage pulse;
   performing an erase operation with respect to the plurality of memory cells using the erase voltage pulse; and
   performing a verification operation while increasing the voltage level of the erase verification voltage until the threshold voltage of the plurality of memory cells is lower than the erase verification voltage.

4. The data erasing method according to claim 3, wherein the initial level of the erase voltage pulse is set as a voltage level when the erase operation has been successfully performed before.

5. The data erasing method according to claim 1, wherein increasing the voltage level of the erase voltage pulse and applying the erase voltage pulse to the plurality of memory cells comprises:
   increasing the voltage level of the erase voltage pulse by the increased voltage level of the erase verification voltage; and
   performing an erase operation with respect to the plurality of memory cells using the increased erase voltage pulse.

6. The data erasing method according to claim 2, wherein increasing the voltage level of the soft programming voltage pulse comprises:
   performing a soft programming operation with respect to the plurality of memory cells using the soft programming voltage pulse;
   verifying whether the maximum threshold voltage of the plurality of memory cells has reached the erase verification voltage; and
   increasing the soft programming voltage pulse by a predetermined level and applying the soft programming voltage pulse to the plurality of word lines when the maximum threshold voltage of the plurality of memory cells has not reached the erase verification voltage.

7. The data erasing method according to claim 1, wherein the plurality of memory cells are flash memory cells.

8. A semiconductor memory apparatus comprising:
   a memory unit including a plurality of memory cells; and
   a control unit configured to, if a threshold voltage of the plurality of memory cells, for which an erase operation has been performed using an erase voltage pulse, is higher than an erase verification voltage, increase a voltage level of the erase verification voltage applied to a plurality of word lines of the plurality of memory cells until the threshold voltage of the plurality of memory cells is lower than the erase verification voltage, increase a voltage level of the erase voltage pulse by an increased voltage level of the erase verification voltage, and apply the erase voltage pulse to the plurality of memory cells.

9. The semiconductor memory apparatus according to claim 8, wherein, when the threshold voltage of the plurality of memory cells, for which the erase operation has been performed using the erase voltage pulse, is lower than the erase verification voltage, the control unit increases a voltage level of a soft programming voltage pulse applied to the plurality of word lines until a maximum threshold voltage of the plurality of memory cells reaches the erase verification voltage.

10. The semiconductor memory apparatus according to claim 8, wherein, when increasing the voltage level of the erase verification voltage, the control unit sets an initial level of the erase voltage pulse, performs an erase operation with respect to the plurality of memory cells using the erase voltage pulse, and performs a verification operation while increasing the voltage level of the erase verification voltage until the threshold voltage of the plurality of memory cells is lower than the erase verification voltage.

11. The semiconductor memory apparatus according to claim 10, wherein the control unit sets the initial level of the erase voltage pulse as a voltage level when the erase operation has been successfully performed before.

12. The semiconductor memory apparatus according to claim 8, wherein, when increasing the voltage level of the erase voltage pulse and applying the erase voltage pulse to the plurality of memory cells, the control unit increases the voltage level of the erase voltage pulse by the increased voltage level of the erase verification voltage, and performs an erase operation with respect to the plurality of memory cells using the increased erase voltage pulse.

13. The semiconductor memory apparatus according to claim 9, wherein, when increasing the voltage level of the soft programming voltage pulse, the control unit performs a soft programming operation with respect to the plurality of memory cells using the soft programming voltage pulse, verifies whether the maximum threshold voltage of the plurality of memory cells has reached the erase verification voltage, and increases the soft programming voltage pulse by a predetermined level and applying the soft programming voltage pulse to the plurality of word lines when the maximum threshold voltage of the plurality of memory cells has not reached the erase verification voltage.

14. The semiconductor memory apparatus according to claim 8, wherein the plurality of memory cells are flash memory cells.

\* \* \* \* \*